United States Patent
Hua et al.

(10) Patent No.: US 7,141,739 B2
(45) Date of Patent: Nov. 28, 2006

(54) SEALING DEVICE AND APPARATUS

(76) Inventors: Yuen-Sheng Hua, No.524, Minzu Rd., Pingtung City, Pingtung County 900 (TW); Chih-Shen Yang, No. 8, Dong-an Rd., Kouhu Township, Yunlin County 653 (TW); Min-Jhe Chiang, No.436, Jhongshan Rd., Miaoli City, Miaoli County 360 (TW)

( * ) Notice: Subject to any disclaimer, the term of this patent is extended or adjusted under 35 U.S.C. 154(b) by 0 days.

(21) Appl. No.: 10/836,552

(22) Filed: Apr. 30, 2004

(65) Prior Publication Data

US 2005/0241844 A1   Nov. 3, 2005

(51) Int. Cl.
*H02G 3/00*   (2006.01)

(52) U.S. Cl. .................. 174/100; 174/50.5; 174/52.3; 174/50; 404/25; 220/4.02; 248/906; 439/535

(58) Field of Classification Search ................ 174/100, 174/50.5, 52.3, 50.51, 50; 220/4.02; 439/535, 439/548, 559; 248/906; 404/25

See application file for complete search history.

(56) References Cited

U.S. PATENT DOCUMENTS

| | | | | |
|---|---|---|---|---|
| 4,857,668 | A | * | 8/1989 | Buonanno ............... 174/35 GC |
| 5,045,635 | A | * | 9/1991 | Kaplo et al. ............ 174/35 GC |
| 5,414,355 | A | * | 5/1995 | Davidson et al. ......... 324/207.2 |
| 5,736,675 | A | * | 4/1998 | Michaels .................... 174/50.5 |
| 6,114,633 | A | * | 9/2000 | Duhancik ............. 174/152 GM |
| 6,229,088 | B1 | * | 5/2001 | Launtz ..................... 174/50.51 |
| 6,362,421 | B1 | * | 3/2002 | Layton, Jr. .................... 174/50 |
| RE37,627 | E |  | 4/2002 | Hirano |
| 6,770,818 | B1 | * | 8/2004 | Puchegger ................... 174/100 |

* cited by examiner

*Primary Examiner*—Dhiru R. Patel

(57) ABSTRACT

A sealing device effects a seal between a first member and a second member of a hermetic chamber. The sealing device includes a body having an elongated shape forming a closed loop. The body of the sealing device includes magnetic material and further includes a) a first and a second sealing portions, and b) at least one internal compartment formed by walls undulatingly extending between the first and second sealing portions. A sealing apparatus includes a first member of a hermetic chamber, a second member of the hermetic chamber, and the above sealing device.

27 Claims, 5 Drawing Sheets

SEALING DEVICE AND APPARATUS

FIELD OF THE INVENTION

The present invention relates to hermetic chambers and more particularly to sealing devices and apparatuses for such chambers.

DESCRIPTION OF RELATED ART

Sealing devices such as sealing rings are typically used to maintain sealing apparatuses such as hermetic chambers airtight, in particular when the pressure of air or other gas inside the chamber is different from that outside or when the chamber contains gas different from that of the outside environment. However, because of the structure, shape, and material of the sealing ring, many hermetic chambers do not achieve the expected sealing result.

In the semiconductor industry, there is a continuing effort to increase yield rate by reducing defects caused by particles and contaminants during various stages of semiconductor manufacturing processes. For example, to dry solutions remaining on wafers, a spin dryer, such as that shown in FIG. 1 within a hermetic chamber comprising a chamber body 110, a lid 120, and a sealing ring 130 fastened to the lid 120, is used. After the chamber is sealed, no environment air should enter into the chamber containing the spin dryer except through a filter such as a Hepa filter. However, when the sealing ring 130 does not function well, environment air with particles 150 can flow into the chamber through a fissure 160 between the sealing ring 130 and the chamber body 110.

FIG. 2 depicts a prior art Kaijo type sealing ring 130 having a lower part 170 in a round shape which more easily generates a fissure 160. In addition, the shape of the upper part 180 of the sealing ring 130 is more susceptible to accumulating dust and particles which may enter the spin dryer chamber and cause defects on wafers. In addition, the round shape of the upper part 180 makes it very difficult to clean and maintain the sealing ring 130.

SUMMARY OF THE INVENTION

A sealing device effects a seal between a first member and a second member of a hermetic chamber. The sealing device comprises a body having an elongated shape forming a closed loop. The body of the sealing device comprises magnetic material and further includes a) a first and a second sealing portions, and b) at least one internal compartment formed by walls undulatingly extending between the first and second sealing portions.

A sealing apparatus comprises a first member of a hermetic chamber, a second member of the hermetic chamber, and the above sealing device.

BRIEF DESCRIPTION OF THE DRAWINGS

A more complete understanding of the present invention can be obtained by reference to the detailed description of embodiments in conjunction with the accompanying drawing, in which.

DETAILED DESCRIPTION OF THE INVENTION

Figure 1:
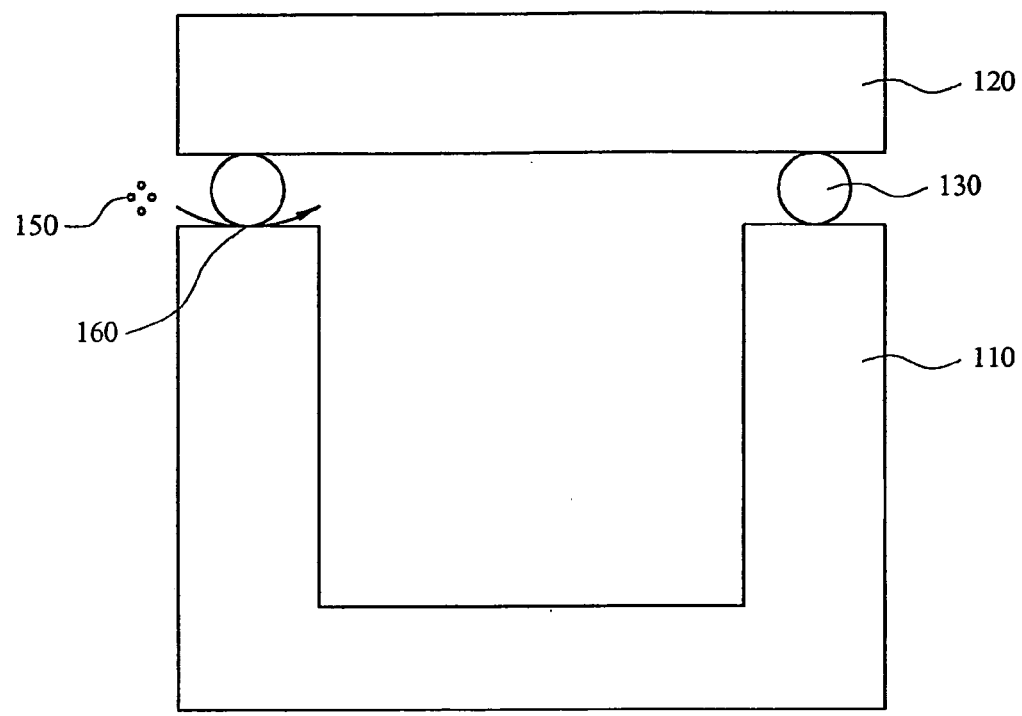
FIG. 1 (prior art) illustrates a cross sectional view of a prior art hermetic chamber employing a conventional sealing device disposed between the lid and body of the chamber.
Figure 2:
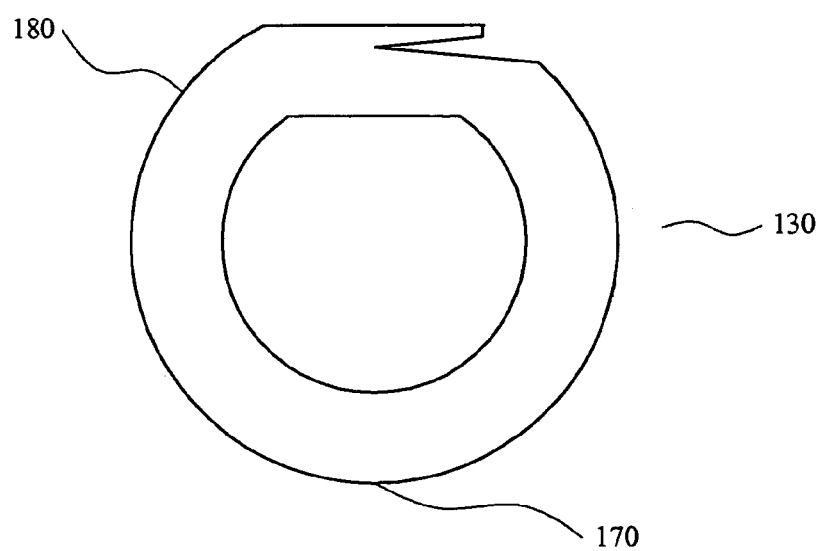
FIG. 2 (prior art) is a cross sectional view of the conventional sealing device shown in FIG. 1.
Figure 3:
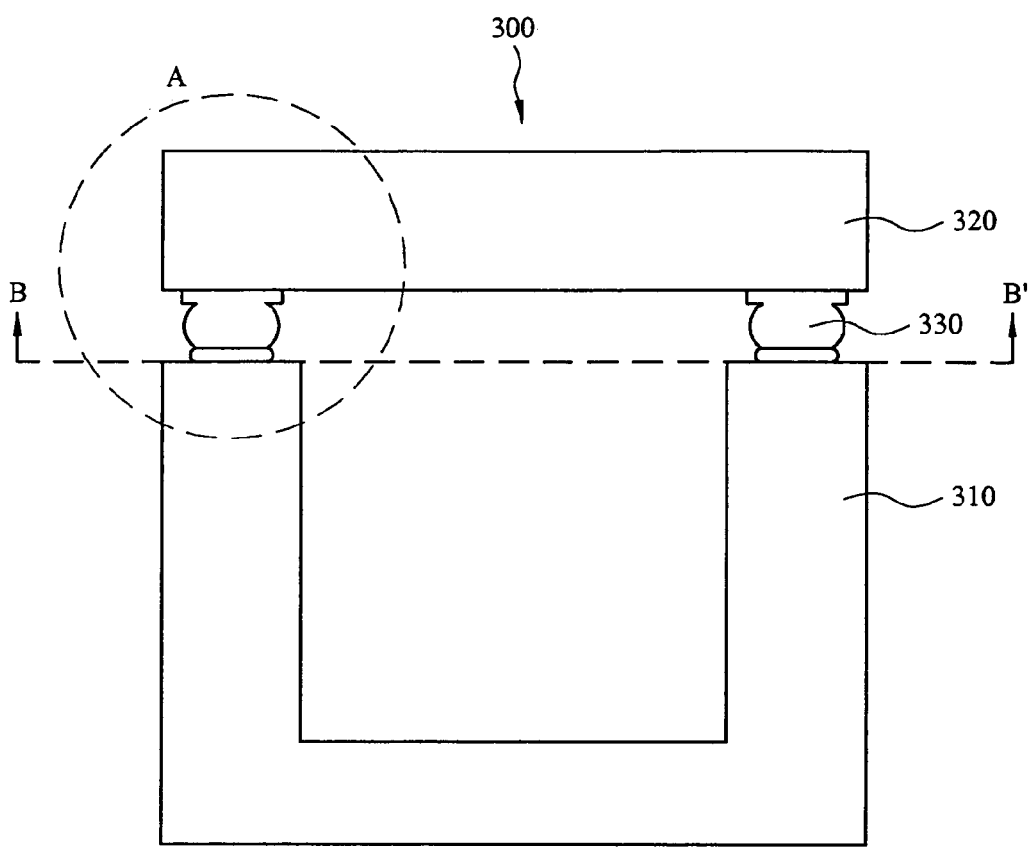
FIG. 3 illustrates a cross sectional view of a sealing apparatus which comprises a lid and a container of a hermetic chamber employing an embodiment of a sealing device therebetween to effect a seal.

As shown in FIG. 3, an exemplary embodiment of a sealing apparatus is a hermetic chamber 300 comprising a container 310 which is a first member of the hermetic chamber, a lid 320 which is a second member of the hermetic chamber, and an embodiment of a sealing device 330 which is disposed between the lid 320 and the container 310. The container 310 can be a chamber portion of a wet bench spin dryer used in semiconductor manufacturing, or of any container or enclosure of a hermetic type which needs to be airtight. The lid 320 can be a lid or cover portion of the wet bench spin dryer, or of any hermetic type container or enclosure which needs to be airtight.

Figure 7:
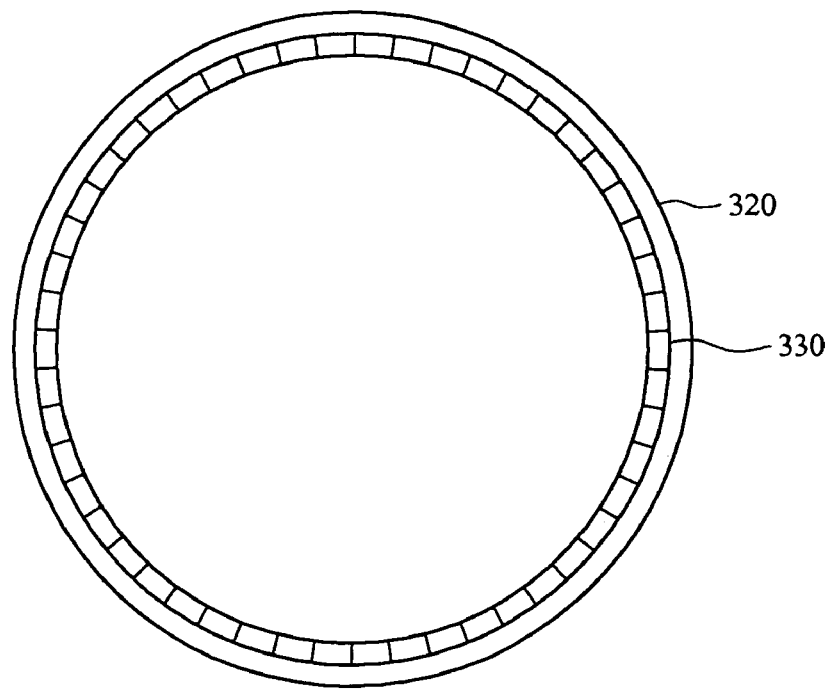
FIG. 7 illustrates a view of the sealing device from line BB' in FIG. 3.

The sealing device 330 has a body with an elongated shape forming a closed loop. For example, FIG. 7 shows the bottom view of the sealing device 330 and the lid 320 in FIG. 3. In this embodiment, the sealing device 330 forms a round loop. Ordinary people in the art will understand that a sealing device can form a loop of other shapes such as a rectangular loop. The sealing device 330 comprises silicone, a fluoroelastomer such as VITON, or a flour seal plastic, which is a soft, pliable, or tender seal plastic. Many other elastic materials can be used. In addition, the sealing device 330 comprises magnetic material to increase a sealing effect.

Figure 4A:
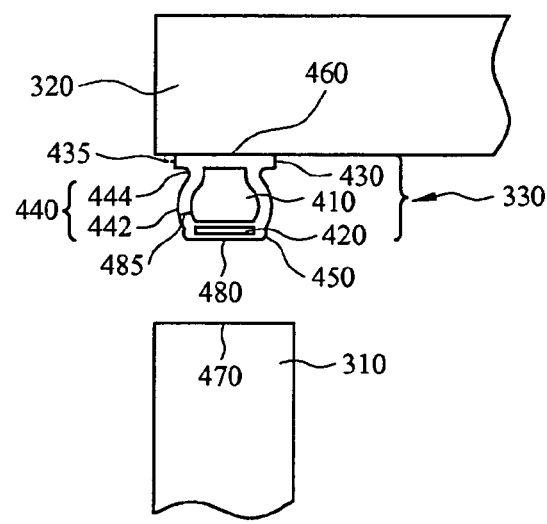
FIG. 4A illustrates an enlarged view of that portion of in FIG. 3 enclosed within circle A depicting, in cross section, the embodiment of the sealing device and sealing apparatus shown in FIG. 3.

As shown in cross section in FIG. 4A, the sealing device 330 comprises a first sealing portion 430, a second sealing portion 450, and an internal compartment 410 formed by walls undulatingly extending between the first and second sealing portions. The outer surfaces of the first sealing portion 430 form an approximately 90 degrees angle 435 with a lower sealing surface 460 of the lid 320. The second sealing portion 450 has a flat surface 480 to contact with an upper sealing surface 470 of the container 310. The internal compartment 410 contains compressible material, such as air. The outer surfaces 440 extending between the first and second sealing portions form an undulating shape with a crest 442 and a trough 444. An internal magnetic compartment 420 disposed in the second sealing portion 450 contains a magnetic material such as NdFeB.

In this embodiment, the first sealing portion 430 of the sealing device 330 is attached to the lid 320 by using glue, screws and other means known to those skilled in the art. When the container 310 is in sealing engagement with the lid 320 with the sealing device 330 disposed therebetween, the second sealing portion 450 contacts the container 310 which comprises metal. As a result, the attractive force between the magnetic material in the internal magnetic compartment 420 and the metal in the container 310 improves the sealing effect. Besides, the internal compartment 410 of the sealing device 330 is compressed to certain extent in the sealing engagement. If the internal compartment 410 is strongly compressed, in order to release some compressive material such as air from the internal compartment 410 into the outside of the sealed container such as a spin dryer, there may be some small holes 485 disposed on the walls forming the internal compartment 410.

Figure 4B:
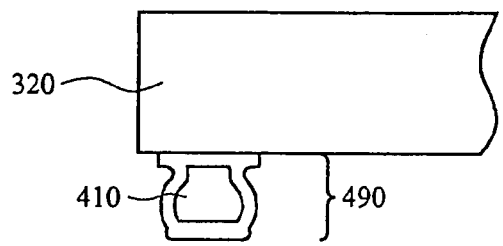
FIG. 4B is an enlarged view of that portion of in FIG. 3 enclosed within circle A depicting, in cross section, another embodiment of the sealing device and sealing apparatus of the present invention with one internal compartment.
Figure 4B:
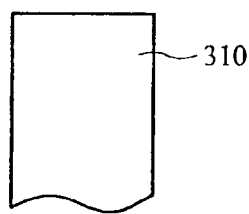

FIG. 4B demonstrates another embodiment of the sealing device 490 of the present invention. The sealing device 490 does not have an internal magnetic compartment. Powders of magnetic material such as NdFeB can be blended together with silicone and/or a fluoroelastomer while manufacturing the sealing device 490 to make the resultant sealing ring magnetic. According, a sealing effect can be increased by the attractive force between the sealing device 490 and the container 310 which comprises metal and/or by the attractive force between the sealing device 490 and the lid 320 which comprises metal.

Figure 5:
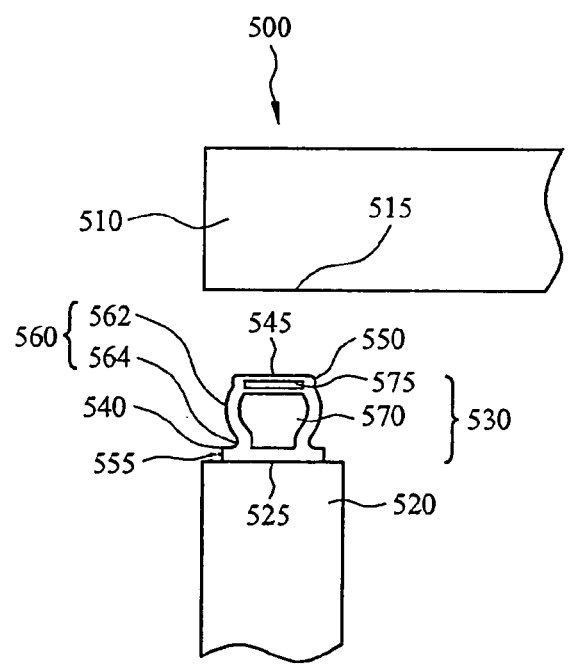
FIG. 5 illustrates, in cross section, another embodiment of a sealing device and sealing apparatus of the present invention.

In another embodiment of a sealing apparatus illustrated in FIG. 5, a lid 510, which is the first member of a sealing apparatus, can be a cover portion of a wet bench spin dryer used in semiconductor manufacturing, or of any hermetic container or enclosure which needs to be airtight. A container 520, which is the second member of the sealing apparatus, can be a chamber portion of the wet bench spin dryer, or any hermetic enclosure which needs to be airtight. A sealing device 530 is disposed between the lid 510 and the container 520. In this embodiment, the sealing device 530 is fastened to the container 520 by using glue, screws and other means known to those skilled in the art.

The sealing device 530 comprises a first sealing portion 540, a second sealing portion 550, and an internal compartment 570 formed by walls undulatingly extending between the first and second sealing portions. The outer surfaces of the first sealing portion 540 form an approximately 90 degrees angle 555 with an upper sealing surface 525 of the container 520. The second sealing portion 550 has a flat surface 545 to contact with a lower sealing surface 515 of the lid 510. An internal compartment 570 contains compressible material, such as air. The outer surfaces 560 extending between the first and second sealing portions form an undulating shape with a crest 562 and a trough 564. An internal magnetic compartment 575 disposed in the second sealing portion 550 contains a magnetic material such as NdFeB. The lid 510 comprises metal. As a result, the attractive force between the magnetic material in the internal magnetic compartment 575 and the metal in the lid 510 improves the sealing effect.

Figure 6:
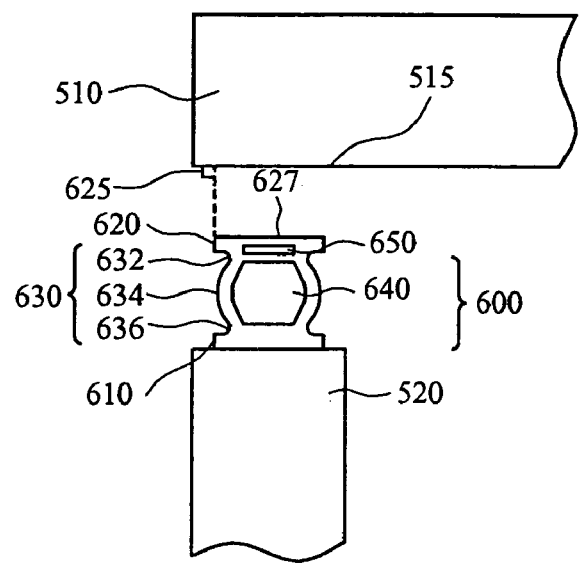
FIG. 6 illustrates yet another embodiment of a sealing device and sealing apparatus of the present invention.

In FIG. 6, another embodiment of a sealing device 600 disposes between the lid 510 and the container 520. The sealing device 600 comprises a first sealing portion 610, a second sealing portion 620, and an internal compartment 640 formed by walls undulatingly extending between the first and second sealing portions. The second sealing portion 620 has a flat surface 627 to contact with a lower sealing surface 515 of the lid 510. In addition, the outer surfaces of the second sealing portion 620 form an approximately 90 degrees angle 625 with the lower sealing surface 515 of the lid 510 when the container 520 is in sealing engagement with the lid 510. The outer surfaces 630 extending between the first and second sealing portions form an undulating shape with a crest 634 and two troughs 632 and 636. An internal magnetic compartment 650 disposed in the second sealing portion 620 contains a magnetic material.

Figure 8:
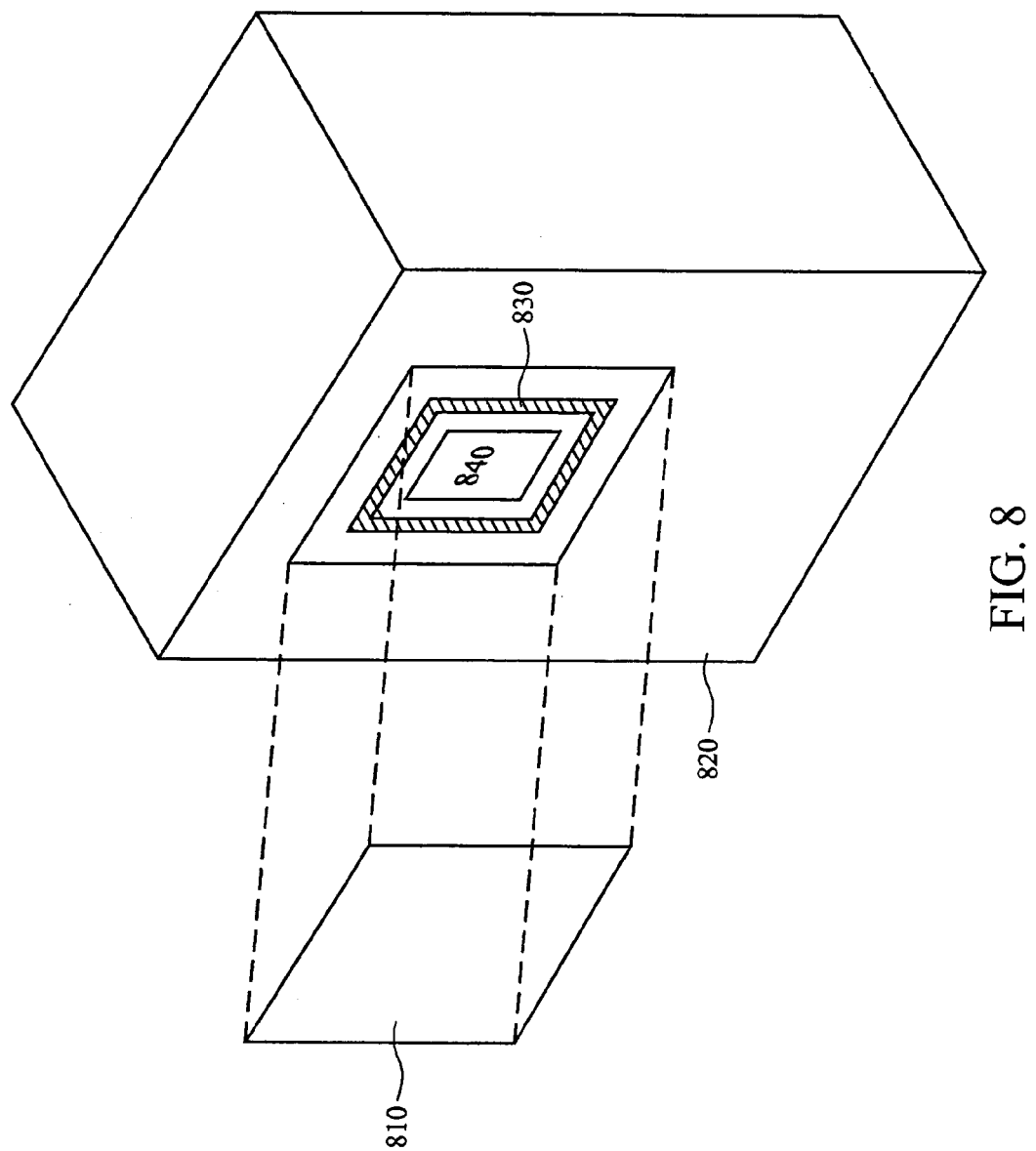
FIG. 8 illustrates another embodiment of a sealing device and sealing apparatus.

In FIG. 8, another embodiment of a sealing apparatus comprises a first member 810, a second member 820 with an opening 840, and a sealing device 830 fastened to the second member 820. The body of the sealing device 830 can be an elongated loop in a rectangular shape. The second member 820 may enclose a fairly large space where machines, such as a process chamber and a metrology device, can be installed inside. The first member 810 can be a window or a door to the second member 820. By a screw, a spring, and/or a compressor, the first member 820 can be in sealing engagement with the second member 820 with the sealing device 830 disposed therebetween.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A sealing device to effect a seal between a first member and a second member of a hermetic chamber, said sealing device comprising a body having an elongated shape forming a closed loop, said body comprising magnetic material and further including:
    a) first and second sealing portions;
    b) at least one hollow internal compartment formed by at least one wall extending between said first and second sealing portions.

2. The sealing device of claim 1, wherein said closed loop is of round shape or rectangular shape.

3. The sealing device of claim 1, wherein said body comprises an elastic material.

4. The sealing device of claim 1, wherein said magnetic material comprises neodymium iron boron.

5. The sealing device of claim 1, wherein:
    said first sealing portion of said body is able to fasten to said second member; and
    said second sealing portion of said body is able to contact said first member which comprises metal.

6. The sealing device of claim 5, wherein said first sealing portion of said body forms approximately 90 degrees angle with a sealing surface of said second member.

7. The sealing device of claim 5, wherein said second sealing portion of said body has a flat surface to contact with said first member.

8. The sealing device of claim 5, wherein said second sealing portion of said body forms approximately 90 degrees angle with a sealing surface of said first member.

9. Semiconductor equipment to effect a seal between a first member and a second member of a hermetic chamber, said semiconductor equipment comprising:
    a body having an elongated shape forming a closed loop, said body comprising magnetic material and further including:
        a) first and second sealing portions; and
        b) at least one hollow internal compartment formed by at least one wall extending between said first and second sealing portions;
    wherein said first sealing portion of said body is able to fasten to said second member;
    said second sealing portion of said body is able to contact said first member which comprising metal; and
    wherein said second sealing portion has an internal magnetic compartment.

10. The semiconductor equipment of claim 9, wherein said internal magnetic compartment contains magnetic material.

11. A sealing apparatus, comprising:
    a first member of a hermetic chamber;
    a second member of said hermetic chamber; and
    a sealing device disposed between said first member and said second member to effect a seal, said sealing device comprising a body having an elongated shape forming a closed loop, said body comprising magnetic material and further including:
    a) a first and a second sealing portions;
    b) at least one hollow internal compartment formed by walls undulatingly extending between said first and second sealing portions.

12. The sealing apparatus of claim 11, wherein said closed loop is of round shape or rectangular shape.

13. The sealing apparatus of claim 11, wherein said body comprises an elastic material.

14. The sealing apparatus of claim 11, wherein said magnetic material comprises neodymium iron boron.

15. The sealing apparatus of claim 11, wherein:
    said first sealing portion of said body is fastened to said second member; and
    said second sealing portion of said body is able to contact said first member which comprises metal.

16. The sealing apparatus of claim 15, wherein said first sealing portion of said body forms approximately 90 degrees angle with a sealing surface of said second member.

17. The sealing apparatus of claim 15, wherein said second sealing portion of said body has a flat surface to contact with said first member.

18. The sealing apparatus of claim 15, wherein said second sealing portion of said body forms approximately 90 degrees angle with a sealing surface of said first member.

19. The sealing apparatus of claim 15, wherein said second sealing portion has an internal magnetic compartment.

20. The sealing apparatus of claim 19, wherein said internal magnetic compartment contains magnetic material.

21. The sealing apparatus of claim 15, wherein said first member is a container of said hermetic chamber and said second member is a lid of said hermetic chamber.

22. The sealing apparatus of claim 21, wherein said hermetic chamber is a spin dryer.

23. The sealing apparatus of claim 15, wherein said second member is a container of said hermetic chamber and said first member is a lid of said hermetic chamber.

24. The sealing apparatus of claim 23, wherein said hermetic chamber is a spin dryer.

25. The sealing apparatus of claim 15, wherein said first member is an enclosure with an opening and said second member is a door or window to cover said opening.

26. The sealing apparatus of claim 15, wherein said second member is an enclosure with an opening and said first member is a door or window to cover said opening.

27. A sealing apparatus comprising:
    a container comprising metal;
    a lid; and
    a sealing device disposed between said container and said lid to effect a seal, said sealing device comprising a body having an elongated shape forming a closed loop, said body comprising magnetic material and further including:
    a) first and second sealing portions;
    b) at least one internal compartment formed by walls undulatingly extending between said first and second sealing portions;
    wherein said first sealing portion is fastened to said lid and forms approximately 90 degrees angle with a sealing surface of said lid; and said second sealing portion has a flat surface to contact said container.

* * * * *

UNITED STATES PATENT AND TRADEMARK OFFICE
CERTIFICATE OF CORRECTION

| | | |
|---|---|---|
| PATENT NO. | : 7,141,739 B2 | Page 1 of 1 |
| APPLICATION NO. | : 10/836552 | |
| DATED | : November 28, 2006 | |
| INVENTOR(S) | : Yuen-Sheng Hua, Chih-Shen Yang and Min-Jhe Chiang | |

It is certified that error appears in the above-identified patent and that said Letters Patent is hereby corrected as shown below:

Column 4, line 65, delete "comprising" and insert therefore -- comprises --.

Column 5, line 12, delete "a" (both occurrences).

Column 5, line 14, delete "walls undulatingly" and insert therefore -- at least one wall --.

Signed and Sealed this

Twenty-fourth Day of July, 2007

JON W. DUDAS
*Director of the United States Patent and Trademark Office*

UNITED STATES PATENT AND TRADEMARK OFFICE
CERTIFICATE OF CORRECTION

PATENT NO. : 7,141,739 B2  
APPLICATION NO. : 10/836552  
DATED : November 28, 2006  
INVENTOR(S) : Yuen-Sheng Hua et al.

Page 1 of 1

It is certified that error appears in the above-identified patent and that said Letters Patent is hereby corrected as shown below:

Title page, insert item (73)

-- (73) Assignee: Taiwan Semiconductor Manufacturing Co., Ltd.
Hsin-Chu, Taiwan --

Signed and Sealed this
Tenth Day of May, 2011

David J. Kappos
*Director of the United States Patent and Trademark Office*